May 5, 1970 D. J. CARLSON 3,510,802

ULTRA-HIGH FREQUENCY TRANSISTOR OSCILLATOR

Filed Feb. 28, 1968

INVENTOR
DAVID J. CARLSON
By Eugene M. Whitacre
Attorney

United States Patent Office 3,510,802

Patented May 5, 1970

3,510,802

ULTRA-HIGH FREQUENCY TRANSISTOR OSCILLATOR

David J. Carlson, Indianapolis, Ind., assignor to RCA Corporation, a corporation of Delaware Filed Feb. 28, 1968, Ser. No. 708,960
Int. Cl. H03b *5/18*
U.S. Cl. 331—117 2 Claims

ABSTRACT OF THE DISCLOSURE

A transistor UHF oscillator, including tuning means having a desired tank circuit and parasitic oscillatory circuit path, has an emitter circuit arrangement to permit the utilization of transistor units as the active element in the oscillator with a wide range in $g_m$ from unit to unit.

Figure 2:
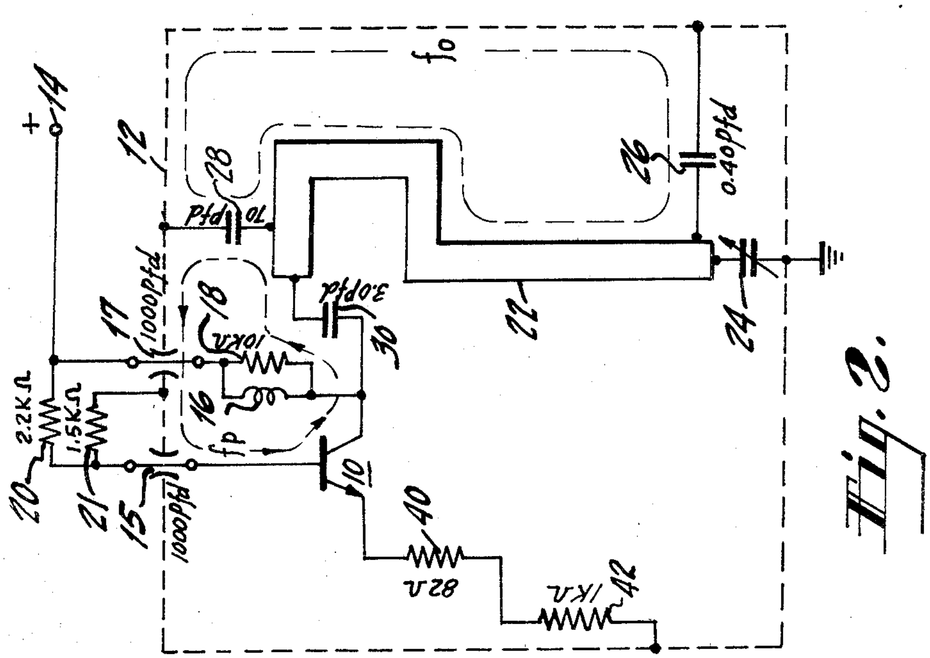

This invention relates to ultra-high frequency oscillators and more particularly to ultra-high frequency transistor oscillators.

In the design of ultra-high frequency (UHF) oscillators, it has been found that there will be more than one tank circuit available to the transistor. One tank circuit is the tank circuit that is required to tune the transistor oscillator over the desired band of high frequencies. Associated with this necessary tank circuit is a second parasitic tank circuit. If the total loading on the desired UHF tank circuit is sufficient, then the transistor may have more available gain at the parasitic frequency and begin to oscillate in the parasitic mode.

Prior efforts to avoid the problem of parasitic oscillations have involved designing the UHF tank circuit so that the parasitic tank circuit is above the cutoff frequency of the transistor. Nevertheless, where high $g_m$ transistors are utilized in the oscillator, spontaneous parasitic oscillations may occur when the desired UHF tank is loaded. This is because heavy loading of the desired UHF tank prevents a sufficient amount of power from regeneratively being fed back to the input of the oscillator. Hence, oscillations in the desired mode cease. However, if the $g_m$ of the transistor is sufficiently high, the cutoff frequency of the unit may be above the resonant frequency of the parasitic tank. In such case, the conditions necessary for parasitic oscillations may be present and such oscillations occur.

Once parasitic oscillations begin, the bias conditions on the transistor change to favor the parasitic frequency, and when the load is removed from the tank circuit, the bias conditions are such that the desired frequency cannot resume and the parasitic frequency remains. It may appear, at this time, that the oscillator is inoperative because no injection current would be flowing as the frequencies involved may be beyond the cutoff frequency of the injection circuit.

Because of the above-mentioned problems with high $g_m$ transistors, it becomes necessary in the production of UHF oscillators to specify within narrow limits the value of $g_m$ which is permissible. In a mass production operation, this becomes a costly controlled procedure and increases the cost of the UHF oscillator. It is, therefore, desirable that a circuit be provided which permits the use of transistors with a wide range in $g_m$ from unit to unit.

A UHF oscillator embodying the present invention includes a transistor which is operated from a source of operating potential. Tuning means are coupled to the collector electrode of the transistor to tune the oscillator throughout the desired high frequency band, the tuning means providing a parasitic oscillatory circuit path. A resistor and a capacitor are serially connected between the emitter electrode of the transistor and the point of reference potential so that the upper frequency of oscillation of the transistor is below the resonant frequency of the parasitic circuit path.

Figure 1:
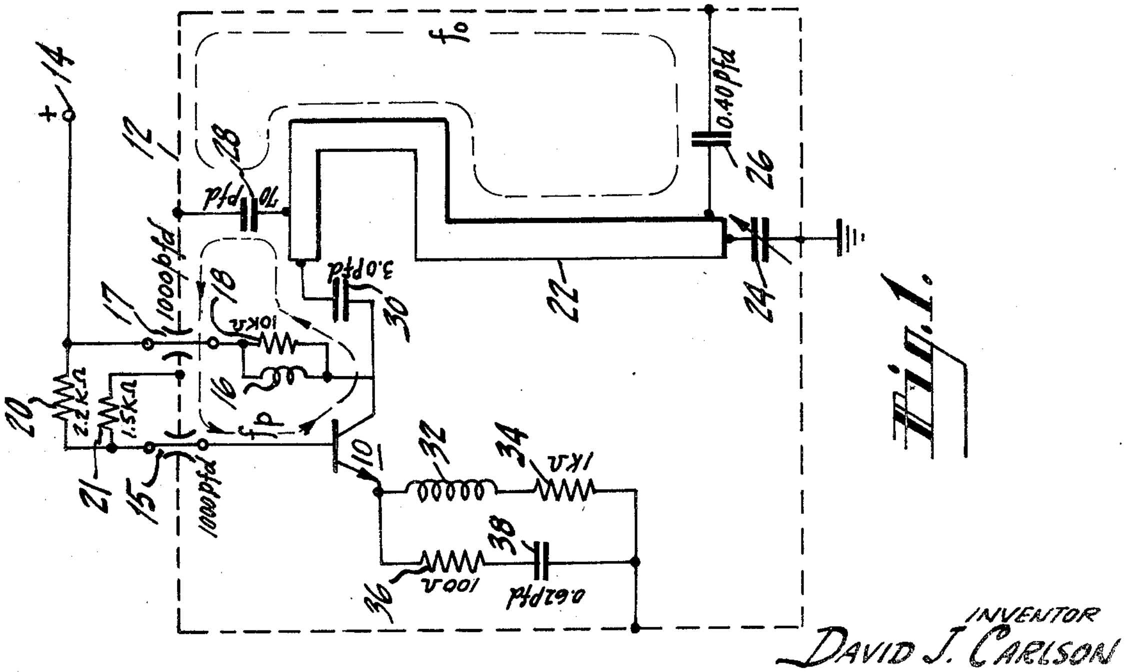

A complete understanding of the invention may be obtained from the following detailed description of a specific embodiment thereof, when taken in conjunction with the accompanying drawings, in which:

FIG. 1 is a schematic circuit diagram of a UHF transistor oscillator embodying the present invention; and FIG. 2 is a schematic circuit diagram of a UHF transistor oscillator shown in FIG. 1 with a resistor physically positioned in relation to the chassis of the oscillator to provide the required capacitance.

Referring now to the drawings wherein like reference numerals are used to designate similar components throughout and particularly to FIG. 1, an ultra-high frequency (UHF) oscillator stage which forms a portion of a UHF tuner includes a transistor 10 which is connected as the active element of the oscillator circuit. The transistor is enclosed in a conductive casing 12 which may be a portion of a UHF tuner chassis. The collector electrode of the transistor 10 is connected to a source of operating potential applied at a terminal 14 through a parallel circuit which includes an inductor 16 and a resistor 18. The inductor 16 is a radio frequency choke which provides a large AC impedance and a small DC resistance in the collector circuit of the transistor 10. The inductance of the inductor 16, however, in conjunction with the intrinsic capacitance of the transistor 10, and other capacities, may resonate at a frequency other than the desired frequency of operation; nevertheless, such oscillations are damped by the resistor 18.

Two resistors 20 and 21 are serially connected between the terminal 14 and the chassis 12. The junction of the resistors is connected to the base electrode of the transistor 10 to provide the necessary base bias. Two feed through capacitors 15 and 17 prevent any radio frequency (RF) signal from passing from the base or collector electrode of the transistor 10 into the source of operating potential applied at the terminal 14.

The frequency of operation of the oscillator circuit is determined by a transmission line comprising an inner conductor 22 and an outer conductor formed by the conductive chassis 12. A variable tuning capacitor 24 is connected between one end of the transmission line conductor 22 and the conductive chassis 12. A trimmer capacitor 26 is connected between the transmission line conductor 22 and the chassis 12. The transmission line, the capacitors 24 and 26, in conjunction with a third capacitor 28 also connected between the transmission line conductor 22 and the conductive chassis 12, form the desired tank circuit for the UHF oscillator.

The collector electrode of the transistor 10 is coupled to the other end of the transmission line conductor 22 through a capacitor 30 to provide coupling between the transistor and the frequency determining network. The coupling provided by the capacitor 30 between the transmission line and the collector electrode of the transistor 10 may be such that the transistor is loosely coupled to the frequency determining network so that changes in the output impedance of the transistor cause a relatively small effect on the frequency determining network of the oscillator circuit.

The desired UHF tank circuit, as previously mentioned, includes the transmission line, the capacitors 24, 26 and 28. However, an additional parasitic tank circuit exists. This parasitic path includes the conductive chassis 12, the feed through capacitor 15, the lead inductance of the base electrode, the base to collector capacity and the lead inductance of the collector electrode of the transistor 10, the capacitor 30, a portion of the transmission line conductor 22 and the capacitor 28. The resonant frequency of the parasitic path is in large measure determined by the physical construction of the oscillator, as for example, transistor electrode lead lengths. The desired UHF oscillator current path and the parasitic oscillator circuit current path are designated by the dashed lines labeled $f_O$ and $f_p$, respectively.

The emitter electrode of the transistor 10 is connected to the chassis 12 by two parallel circuits. The first circuit includes an inductor 32 and a resistor 34 serially connected. The second circuit includes a resistor 36 and a capacitor 38, again, serially connected. The serially connected inductor 32 and resistor 34 provide a DC path between the emitter electrode of the transistor 10 and the conductive chassis. The serially connected resistor 36 and capacitor 38 provide an AC path between the emitter electrode of the transistor 10 and the conductive chassis 12 which becomes more effective with higher frequencies as the capacitive reactance of the capacitor 38 decreases.

For sustained oscillations in the transistor oscillator, the power gain of the amplifier network must be equal or greater than unity. When the amplifier power gain becomes less than unity, the oscillations become smaller with time and are damped. In practical oscillator circuits, however, since the output power is divided between the load and the feed back network, power gains greater than unity are required. Hence, if the desired tank circuit of the UHF oscillator is loaded, as for example, by touching the transmission line conductor 22 during alignment, the heavy loading of the desired tank prevents a sufficient amount of power from regeneratively being fed back to the input of the oscillator. Hence, oscillations in the desired mode cease. Nevertheless, if the $g_m$ of the transistor is sufficiently high, the cutoff frequency of the unit may be above the resonant frequency of the parasitic tank, and the conditions necessary for parasitic oscillations may be present and such oscillations occur.

By including the serially connected resistor 36 and capacitor 38 between the emitter electrode of the transistor 10 of the oscillator and the conductive chassis 12, as the frequency increases, more and more of the feedback signal appearing at the emitter electrode of the transistor is shorted to the conductive chassis 12. In effect, the R-C time constant of the resistor 36 and the capacitor 38 increase the rate at which the transistor high frequency gain falls off. Thus, the cutoff frequency of the transistor is made to be below that of the resonant frequency of the parasitic oscillatory tank. A compromise must be reached between making low $g_m$ units function at the high end of the desired UHF band and preventing high $g_m$ units from going into sponstaneous parasitic oscillations.

Reference is now made to FIG. 2 which is a schematic circuit diagram of the UHF transistor oscillator shown in FIG. 1 with the emitter circuit of the transistor 10 modified. Two resistors 40 and 42 are serially connected between the emitter electrode of the transistor 10 and the conductive chassis 12. The resistor 42 is positioned in relation to the conductive chassis 12 to provide a capacitance such that the first resistor in conjunction with the capacitance limits the upper frequency of oscillation of the transistor 10 as described more fully above in connection with the transistor oscillator of FIG. 1. As a consequence, a DC path is provided between the emitter electrode of the transistor 10 and the conductive chassis through the two serially connected resistors 40 and 42. In addition, however, an AC path is provided between the emitter electrode of the transistor 10 and the conductive chassis 12 which includes the resistor 40 and the distributed capacitance between the resistor 42 and the conductive chassis 12. This AC path becomes more effective at higher frequencies and, consequently, increases the rate at which the transistor high frequency gain falls off to keep the cutoff frequency of the transistor below the resonant frequency of the parasitic oscillatory path. It should be noted that a similar effect can be achieved utilizing one resistor, suitably positioned in relation to the conductive chassis 12, and electrically interconnecting the emitter electrode of the transistor 10 and the conductive chassis 12.

The utilization of the configuration of FIG. 2 wherein the resistor 42 is positioned in relation to the conductive chassis 12 has the advantage of eliminating two electrical components which were utilized in the configuration of FIG. 1, and, consequently, has the added advantage of economy in an extremely competitive industry. That is, the inductor 32 which was required to eliminate the effect of the distributed capacitance associated with the resistor 34, and, in addition, the capacitor 38 are no longer required. Moreover, the configuration of FIG. 2 has the added advantage of allowing freedom of determining the composite R-C time constant by re-positioning the resistor 42 in relation to the conductive chassis 12.

What is claimed is:

1. An oscillator tunable over a desired band of high frequencies comprising:

a chassis of conductive material connected to a point of reference potential;

a transistor enclosed in said conductive chassis, having a collector electrode and emitter electrode and a base electrode and operated from a source of operating potential;

circuit means interconnecting the collector electrode and the base electrode of said transistor with said source of operating potential;

tuning circuit means coupled to said collector electrode to tune said oscillator throughout said high frequency band, said tuning circuit means providing a parasitic oscillatory circuit path; and a first resistor and a second resistor serially connected between the emitter electrode of said transistor and said conductive chassis, said second resistor physically positioned in relation to said conductive chassis to provide a capacitance such that said first resistor in conjunction with said capacitance limits the upper frequency of oscillation of said transistor to a value below the resonant frequency of said parasitic oscillatory circuit path.

2. An oscillator tunable over a desired band of ultrahigh frequencies comprising:

a chassis of conductive material connected to a point of reference potential;

a transistor, enclosed in said conductive chassis, having a collector electrode, an emitter electrode and a base electrode and operated from a source of operating potential;

circuit means interconnecting the collector electrode and the base electrode of said transistor with said source of operating potential;

tuning circuit means including a transmission line and a variable tuning capacitor coupled to said collector electrode to tune said oscillator throughout said ultra-high frequency band said tuning circuit means providing a parasitic oscillatory circuit path;

resistor means connected between the emitter electrode of said transistor and said conductive chassis to provide a DC path between said emitter electrode and said point of reference potential; and said resistor means physically positioned in relation to said conductive chassis to provide a capacitance such that said resistor means in conjunction with said capacitance limits the upper frequency of oscillation of said transistor to a value below the resonant frequency of said parasitic oscillatory circuit path.

References Cited

UNITED STATES PATENTS

| | | | |
|---|---|---|---|
| 1,587,084 | 6/1926 | Robinson | 330—94 |
| 2,391,386 | 12/1945 | Bradley | 331—105 |
| 3,270,292 | 8/1966 | Harwood | 331—117 |
| 3,407,360 | 10/1968 | Buhr | 330—94 |

JOHN KOMINSKI, Primary Examiner

U.S. Cl. X.R.

331—96, 105